United States Patent
Uehara et al.

(10) Patent No.: US 7,316,974 B2
(45) Date of Patent: Jan. 8, 2008

(54) WIRING PATTERN FORMATION METHOD, MANUFACTURING METHOD FOR MULTI LAYER WIRING SUBSTRATE, AND ELECTRONIC DEVICE

(75) Inventors: Noboru Uehara, Okaya (JP); Tsuyoshi Shintate, Matsuyama (JP); Kazuaki Sakurada, Suwa (JP)

(73) Assignee: Seiko Epson Corporation (JP)

( * ) Notice: Subject to any disclaimer, the term of this patent is extended or adjusted under 35 U.S.C. 154(b) by 117 days.

(21) Appl. No.: 11/235,634

(22) Filed: Sep. 26, 2005

(65) Prior Publication Data

US 2006/0127567 A1 Jun. 15, 2006

(30) Foreign Application Priority Data

Sep. 28, 2004 (JP) ............................. 2004-282217

(51) Int. Cl.
H01L 21/44 (2006.01)
(52) U.S. Cl. .................. 438/676; 438/646; 438/632
(58) Field of Classification Search ................ 438/646, 438/632, 676; 257/784, 785, 786
See application file for complete search history.

(56) References Cited

U.S. PATENT DOCUMENTS

| | | | |
|---|---|---|---|
| 5,132,248 A | 7/1992 | Drummond et al. | |
| 6,707,153 B2 | 3/2004 | Kuwabara et al. | |
| 6,864,505 B2 | 3/2005 | Yamasaki | |
| 6,887,650 B2 | 5/2005 | Shimoda et al. | |
| 7,214,617 B2* | 5/2007 | Hirai ........................... | 438/676 |
| 7,244,158 B2* | 7/2007 | Kimura et al. ................ | 445/24 |
| 2005/0208760 A1* | 9/2005 | Ryan ........................... | 438/639 |

FOREIGN PATENT DOCUMENTS

| | | |
|---|---|---|
| JP | 2002-148429 | 5/2002 |
| JP | 2003-317945 | 11/2003 |
| JP | 2004-098012 | 4/2004 |
| JP | 2004-200563 | 7/2004 |
| JP | 2004-241514 | 8/2004 |
| KR | 515064 | 12/2002 |
| KR | 586231 | 5/2004 |
| KR | 594354 | 6/2004 |

OTHER PUBLICATIONS

Communication from Japanese Patent Office re: related application.

* cited by examiner

Primary Examiner—Fernando L. Toledo
Assistant Examiner—Jae Lee
(74) Attorney, Agent, or Firm—Harness, Dickey & Pierce, P.L.C.

(57) ABSTRACT

A wiring pattern formation method in which a wiring pattern is formed by arranging, in a region which is demarcated by a partition wall, liquid material which includes an electrically conductive material, including: arranging a resin material around the periphery of a region upon which the wiring pattern is to be formed; imparting liquid affinity to a demarcated region which has been demarcated by the resin material; narrowing down the demarcated region by flowing out the resin material towards and into the demarcated region; and forming the partition wall by curing the resin material.

6 Claims, 11 Drawing Sheets

FIG. 3

| STEP No. S | PROCESS | DEVICE | CONDITION |
|---|---|---|---|
| 1 | SUBSTRATE WASHING | EXCIMER UV LIGHT (WAVELENGTH 172nm) | 300sec |
| 2 | COATING THE BANKS FOR THE 0-TH INSULATING LAYER | LIQUID DROP EJECTION DEVICE | — |
| 3 | BANK UV CURING | UV LIGHT (WAVELENGTH 365nm) | 4sec |
| 4 | COATING THE 0-TH INSULATING LAYER | LIQUID DROP EJECTION DEVICE | — |
| 5 | UV CURING | UV LIGHT (WAVELENGTH 365nm) | 60sec |
| 6 | CONTROLLING THE CONTACT ANGLE OF THE 1-ST INSULATING LAYER | EXCIMER UV LIGHT (WAVELENGTH 172nm) | 60sec |
| 7 | COATING THE 1-ST IN-LAYER INSULATING LAYER AROUND THE REGIONS FOR AG WIRING | LIQUID DROP EJECTION DEVICE | — |
| 8 | LIQUID AFFINITY IMPARTING PROCESS | EXCIMER UV LIGHT (WAVELENGTH 172nm) | 10sec |
| 9 | UV CURING | UV LIGHT (WAVELENGTH 365nm) | 4sec |
| 10 | CONTROLLING THE CONTACT ANGLE FOR THE 1-ST AG WIRING LAYER | EXCIMER UV LIGHT (WAVELENGTH 172nm) | 15sec |
| 11 | COATING THE 1-ST AG WIRING LAYER | LIQUID DROP EJECTION DEVICE | — |
| 12 | AG BAKING | HOT PLATE | 150°C×30min |
| 13 | COATING THE POSTS FOR THE 1-ST AG WIRING LAYER | LIQUID DROP EJECTION DEVICE | — |
| 14 | AG BAKING | HOT PLATE | 150°C×30min |
| 15 | COATING THE 1-ST INTERLAYER INSULATING LAYER | LIQUID DROP EJECTION DEVICE | — |
| 16 | UV CURING | UV LIGHT (WAVELENGTH 365nm) | 60sec |

WIRING PATTERN FORMATION METHOD, MANUFACTURING METHOD FOR MULTI LAYER WIRING SUBSTRATE, AND ELECTRONIC DEVICE

BACKGROUND OF THE INVENTION

1. Field of the Invention

The present invention relates to a wiring pattern formation method, a manufacturing method for a multi layer wiring substrate, and an electronic device.

Priority is claimed on Japanese Patent Application No. 2004-282217, filed Sep. 28, 2004, the content of which is incorporated herein by reference.

2. Description of Related Art

In the manufacture of wiring or the like which is incorporated in an electronic circuit of an integrated circuit, for example, a lithographic method may be used. In such a lithographic method, there is a requirement for large scale equipment such as a vacuum device and complicated processing. Furthermore, with a lithographic method, the cost of manufacturing is high, since the efficiency of utilization of material is only around a few percent, and it is not possible to avoid throwing away almost all of this material. In this connection, as a process to be utilized instead of such a lithographic method, there has been investigated a method of directly patterning a liquid containing functional material upon a substrate using an ink jet apparatus (a so-called liquid drop ejection method). For example, in U.S. Pat. No. 5,132,248, there is proposed a direct patterning method, in which a liquid in which minute electrically conducting particles are dispersed is coated upon a substrate by a liquid drop ejection method, and in which this coated pattern is subsequently converted into an electroconductive layer pattern by performing heat processing and laser irradiation. Furthermore, in Japanese Unexamined Patent Application, First Publication 2004-241514, there is proposed a method of forming a multi layer circuit substrate by forming, in order, an electrically conductive pattern and an insulating pattern by a liquid drop ejection method. Yet further, Japanese Unexamined Patent Application, First Publication 2004-200563, there is proposed a method of forming, with a liquid drop ejection method, an insulating layer embedded between one wiring line and another.

Recently, the increase of the density of the circuitry incorporated in devices has progressed remarkably, and thus, for example, there are incessant demands for making wiring patterns yet smaller and finer. However, when attempts are made to form such very fine wiring patterns by a liquid drop method of the type described above, difficulties arise in forming these fine wiring patterns accurately and stably, since, after striking the substrate, the liquid drops which are ejected tend to wet the substrate and spread out over it.

SUMMARY OF THE INVENTION

The present invention has been conceived in the light of the above described problem, and it takes as an object to provide a method which is capable of forming a minute wiring pattern in a stable manner with good accuracy. Furthermore, it takes as another object to provide a manufacturing method for a multi layer wiring substrate which can form a multi layer wiring pattern of high density with a wiring pattern which has been made yet more minute. Yet further, the present invention takes as still another object to provide an electronic device, including this type of multi layer wiring substrate, whose connection reliability is high.

In order to solve the above described problem, the wiring pattern formation method of the present invention is one in which a wiring pattern is formed by arranging, in a region which is demarcated by a partition wall, liquid material which includes an electrically conductive material, including: a process of arranging a resin material around the periphery of a region upon which the wiring pattern is to be formed; imparting liquid affinity to a demarcated region which has been demarcated by the resin material, and narrowing down the demarcated region by flowing out the resin material towards and into the demarcated region; and a process of forming the partition wall by curing the resin material. Here, it is desirable for the resin material to be arranged in a non-hardened or semi hardened state.

Since, with this method, the region in which the liquid material is arranged is demarcated by the partition wall, accordingly the liquid material does not spread out from this demarcated region. Therefore, it is possible to form a wiring pattern which, as compared with the prior art, has a finer structure and also which has a more even pattern width. Furthermore since, with this method, the resin material which has been deposited in the periphery of the demarcated region is not completely cured, accordingly it is possible to flow it to a certain extent during liquid affinity imparting process of the substrate, which could not be done if it had been completely cured. In other words, it is possible to reduce the size of the demarcated region by taking advantage of this flowing of the resin material, and thus it becomes possible to implement a narrower wiring width than has heretofore been possible to implement with a prior art type liquid drop type ejection device.

In the wiring pattern formation method of the present invention, the liquid affinity imparting process may be performed by irradiating the demarcated region with excimer UV light. In this case, it is possible to utilize, as the excimer UV light, light of a wavelength of 172 nm.

By taking advantage of excimer UV light in this manner, it is possible to perform the liquid affinity imparting process in a simple and easy manner.

In the wiring pattern formation method of the present invention, it is desirable to perform the arrangement process for the resin material by a liquid drop ejection method.

By taking advantage of a liquid drop ejection method in this manner, it is possible to reduce the wastage of material, so that it becomes possible to form the wiring pattern at a lower cost. Although with a liquid drop ejection method it is only possible to form a pattern of a coarser pitch than is possible using a photolithographic method, with the present invention, it is not necessary to narrow down the pitch to such a great extent during the step of depositing the resin material, since it is possible to adjust the pitch of the resin material by the liquid affinity imparting process step which is performed after deposition of the resin material. Accordingly, the merit is great of employing this method, with which it is possible to anticipate reduction of the time of manufacture and reduction of the material cost.

Moreover, the manufacturing method for a multi layer wiring substrate according to the present invention is one for a multi layer wiring substrate which includes a plurality of mutually superimposed wiring layers with an insulating layer between each adjacent pair of superimposed wiring layers, and in which the wiring patterns upon the plurality of wiring layers are mutually electrically connected together via connecting posts which pierce through the insulating layer, in which the wiring pattern included in at least one of the plurality of wiring layers is formed by a wiring pattern formation method according to the present invention as described in any one of the above paragraphs.

According to this method, it is possible to provide a multi layer wiring substrate in which a minute wiring pattern is arranged at a high density.

The electronic device according to the present invention is one which includes a multi layer wiring substrate which has been manufactured by the manufacturing method for a multi layer wiring substrate according to the present invention described above.

According to this structure, it is possible to provide an electronic device which has excellent electrical connection reliability.

BRIEF DESCRIPTION OF THE DRAWINGS

FIG. 3 is a process table for a wiring pattern formation method according to a preferred embodiment of the present invention.

DETAILED DESCRIPTION OF THE INVENTION

In the following, preferred embodiments of the present invention will be explained with reference to the drawings. In these drawings which are utilized in the following explanation, appropriate changes have been made in the scale of the various members, in order to represent them at scales at which they can be easily understood. Furthermore although, in these preferred embodiments, each of the various electrical wires is dealt with as a wiring pattern, in some cases, a plurality of electrical wires is referred to, all together, as a wiring pattern.

Figure 1:
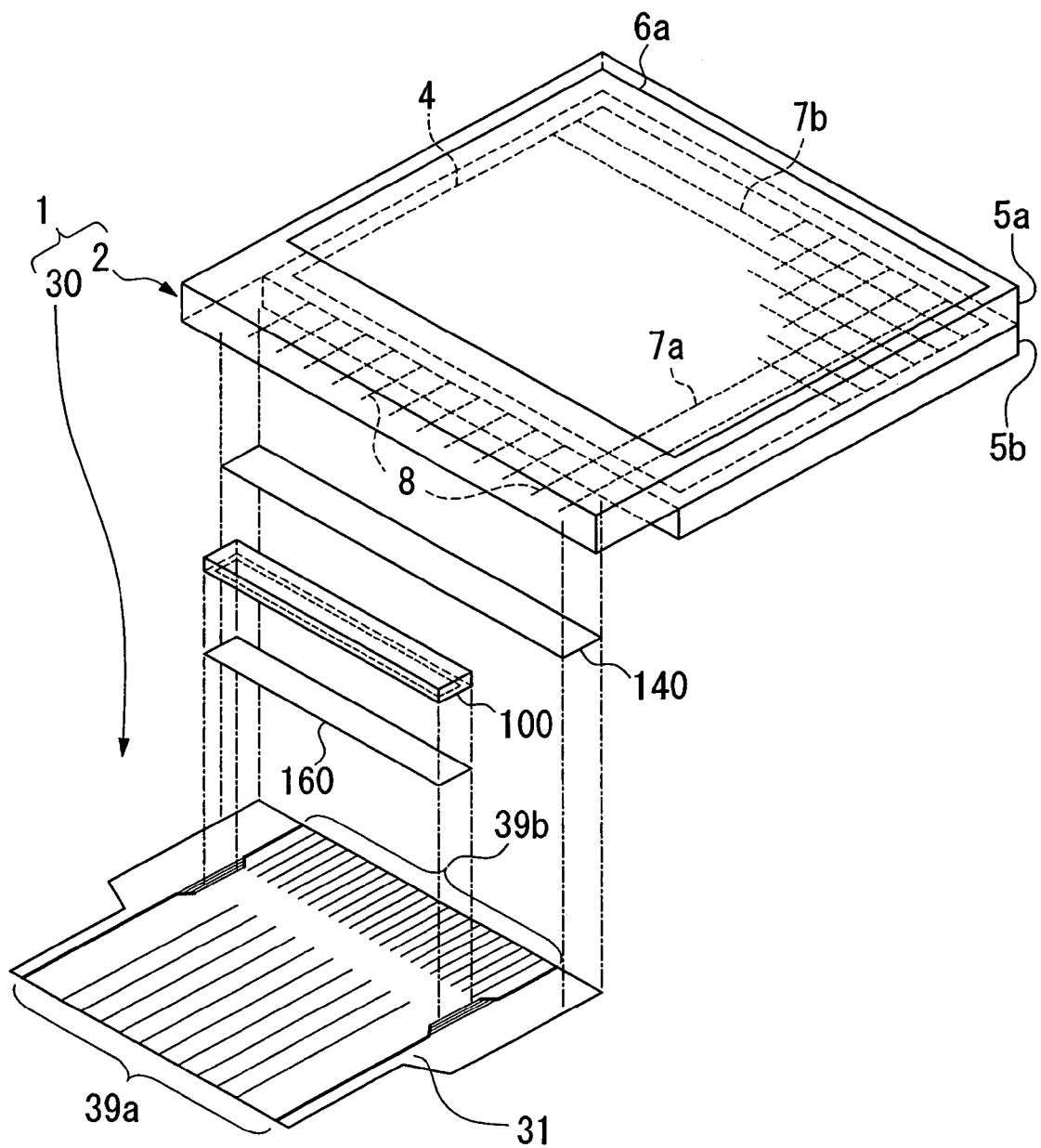
FIG. 1 is an exploded perspective view of a liquid crystal module of a COF construction.

FIG. 1 is an exploded perspective view showing a liquid crystal module of a COF (Chip On Film) construction. In this preferred embodiment, by way of example, an example of a wiring pattern formation method for a flexible printed wiring substrate (Flexible Printed Circuit—hereinafter "FPC") will be explained. This flexible printed wiring substrate includes a plurality of wiring layers which are mutually superimposed with insulating layers between them, with the wiring pattern layers upon the various layers being mutually electrically connected together via connecting posts which pierce through the insulating layers; and it constitutes an embodiment of the multi layer wiring substrate according to the present invention. The FPC 30 is formed with electric wiring patterns 39*a* and 39*b* upon the surface of a film substrate 31 which is flexible. In detail, as will be described hereinafter, with the liquid crystal module 1 of COF construction shown in FIG. 1, the FPC 30 is connected to the edge portion of a liquid crystal panel 2, and an IC 100 for driving the liquid crystal panel 2 is mounted to the surface of the FPC 30 it is arranged to perform image display upon the liquid crystal panel 2 by outputting a drive signal from this IC 100 for liquid crystal drive to the liquid crystal panel 2 via the FPC 30.

—The Wiring Pattern—

Figure 2A:
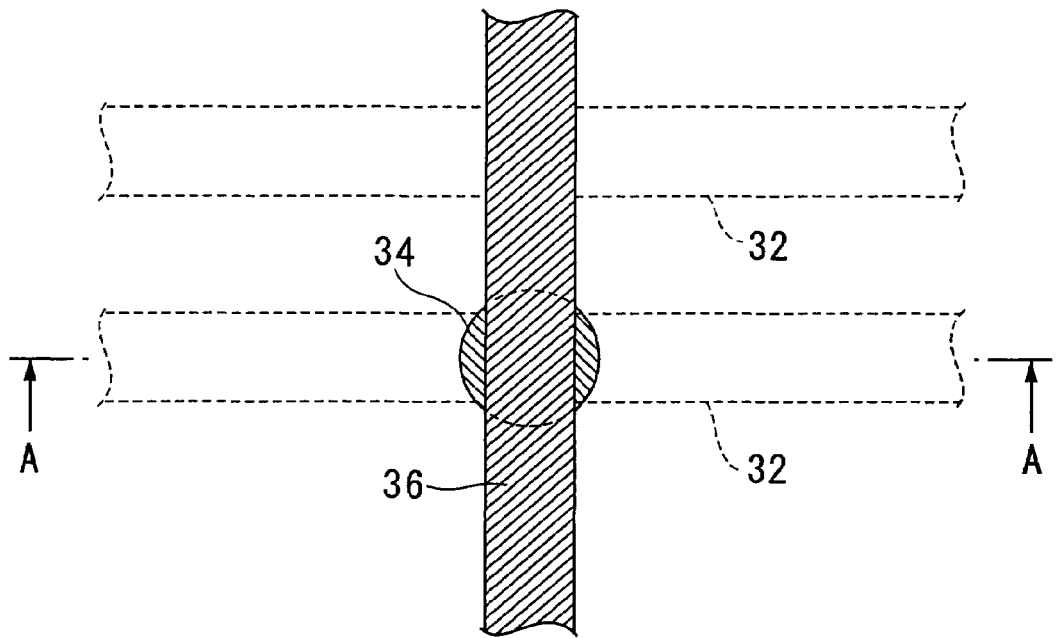
FIG. 2A is a cross-sectional plan view showing a portion of a wiring pattern according to a preferred embodiment of the present invention.
Figure 2B:
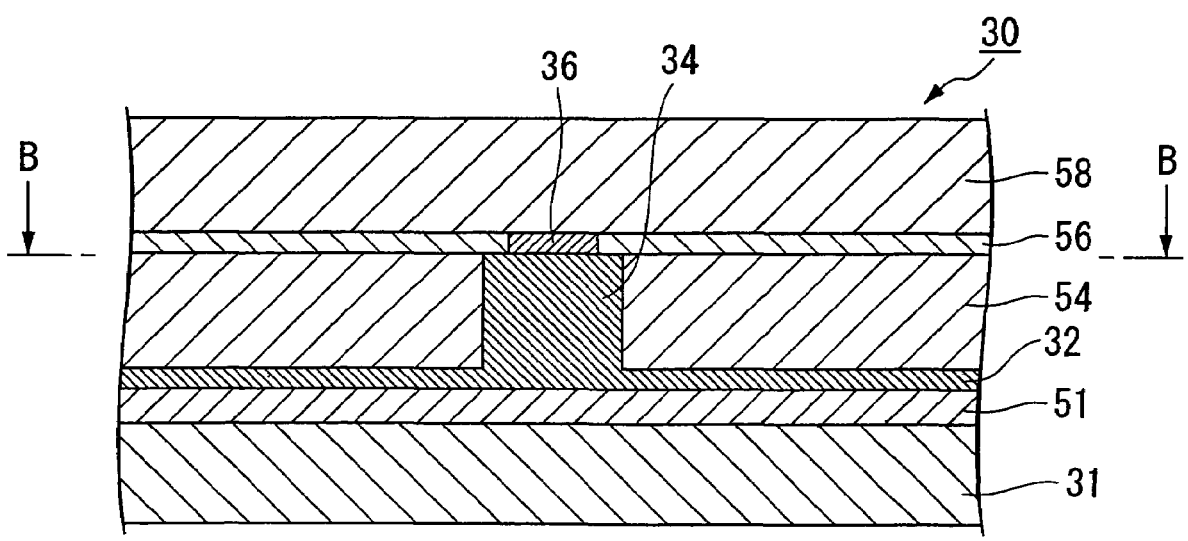
FIG. 2B is a cross-sectional view showing the same.

FIGS. 2A and 2B are explanatory figures showing the wiring pattern of this preferred embodiment of the present invention, and is an enlarged view of a wiring formation portion of the FPC 30. FIG. 2A is a cross-sectional view taken along the line B-B in FIG. 2B, while FIG. 2B is a sectional view taken in a plane shown by the arrows A-A in FIG. 2A. As shown in FIG. 2B, the wiring pattern of this preferred embodiment has a multi layered structure in which a lower layer 32 of electrical wiring and an upper layer 36 of electrical wiring are superimposed with an interlayer insulating layer 54 between them. The wiring patterns described below are only cited by way of example, and it would also be possible to apply the present invention to other different types of wiring pattern.

As shown in FIG. 2B, the FPC 30 includes a film substrate 31, which is flexible and is made from polyimide or the like. A base insulating layer 51 is formed upon the surface of this film substrate 31. This base insulating layer 51 is made of an electrically insulating material which is a mixture of an ultraviolet light curing resin such as an acrylic resin or the like, and a heat curing resin such as an epoxy resin or the like.

A plurality of electric wires 32 are formed upon the surface of this base insulating layer 51. These electric wires 32 are made in a predetermined pattern from an electrically conductive material such as silver (Ag) or the like. An in-layer insulating layer (not shown in the figures) is formed upon the surface of the base insulating layer 51 in the regions in which the electric wires 32 are not formed. By employing a liquid drop ejection method which will be described hereinafter, it becomes possible to achieve a miniaturization in the width of the lines of wiring patterns from a conventional 50 μm to approximately 30 μm, and in the spaces between the lines from a conventional 50 μm to approximately 30 μm.

An interlayer insulating layer 54 is formed so as to cover over the above described electrical wiring layer 32. This interlayer insulating layer 54 is also made from the same resin material as the base insulating layer 51. A connecting post 34 is formed of an equivalent height, so as to pierce through this interlayer insulating layer 54 from a portion of the electrical wiring pattern 32. This connecting post 34 is made in the shape of a cylindrical pillar from an electrically conductive material such as silver (Ag) which is the same as the material for the electric wiring layer 32. By way of example, the thickness of the electrical wires 32 may be about 2 µm, and the connecting post 34 may be formed of a height of about 8 µm.

An upper layer 36 of electrical wiring is formed upon the surface of this interlayer insulating layer 54. This electrical wiring 36 in the upper layer is made from an electrically conductive material such as silver (Ag) or the like, the same as the material for the lower electrical wiring layer 32. As shown in FIG. 2A, these electrical wires 36 in the upper layer may also be disposed so as to intersect the electrical wires 32 in the lower layer. An electrical wire 36 in the upper layer is electrically connected to the upper end portion of the connecting post 34, thus ensuring its electrical connection to an electrical wire 32 in the lower layer.

Furthermore, as shown in FIG. 2B, an in-layer insulating layer 56 is formed upon the surface of the interlayer insulating layer 54 in the regions in which the electric wires 36 are not formed. Yet further, a protective layer 58 is formed so as to cover over the electrical wiring layer 36. This in-layer insulating layer 56 and this protective layer 58 may also be made from the same resin material as the base insulating layer 51.

Although, in the above description, an example has been described of a wiring pattern which has two layers of electrical wiring 32 and 36, it would also be possible to apply the present invention to an electrical wiring pattern which has three or more layers. In such a case, the structure from the n-th layer of electrical wiring through the n+1-th layer of electrical wiring would be the same as the structure from the first layer of electrical wiring 32 through the second layer of electrical wiring 36 described above.

—The Wiring Pattern Formation Method—

Next, the method of forming the wiring pattern according to the preferred embodiment of the present invention will be described.

FIG. 3 is a process diagram for the wiring pattern according to the preferred embodiment of the present invention. Furthermore, FIGS. 4A to 4E are explanatory figures for this wiring pattern according to the preferred embodiment of the present invention. In the following, each of the processes will be explained, in order of the step numbers as shown in the leftmost column of FIG. 3.

First, the surface of the film substrate 31 shown in FIG. 2B is cleaned (in step 1). In concrete terms, excimer ultraviolet radiation of a wavelength of 172 nm is irradiated upon the surface of the film substrate 31 for about 300 seconds. It would also be acceptable to wash the film substrate 31 with a solvent such as water or the like, or to clean it using ultrasonic waves. Furthermore, it would also be acceptable to clean the film substrate 31 by irradiating it with plasma at atmospheric pressure.

Next, as a preliminary to forming the base insulating layer 51 upon the surface of the film substrate 31, banks for the base insulating layer 51 are formed by coating (in step 2). This coating is performed by utilizing a liquid drop ejection method (an ink jet method). In other words, resin material before curing, which is the material for formation of the base insulating layer 51, is ejected along the peripheral edge portions of the formation region for the base insulating layer 51, using a liquid drop ejection device which will be described subsequently.

Next, the resin material which has been ejected is cured (in step 3). In concrete terms, the UV curable resin, which is the material for formation of the base insulating layer 51, is irradiated for about four seconds with UV light of wavelength 365 nm, and is thereby cured. By doing this, banks (dams) are formed at the peripheral edge portions of the formation region for the base insulating layer 51.

Next, the base insulating layer 51 is formed by coating within these banks which have thus been formed (in step 4). This coating also is performed by utilizing a liquid drop ejection method. In concrete words, resin material before curing, which is the material for formation of the base insulating layer 51, is ejected from the liquid drop ejection device which will be described subsequently, while scanning this liquid drop ejection head around the entire interior of the banks. During this process, even if the resin material should have a tendency to flow around after having been ejected, it cannot spread outside the formation region for the base insulating layer 51, because it is stopped and dammed up by the banks which have already been formed around the peripheral edge portions of the formation region.

Figure 4A:
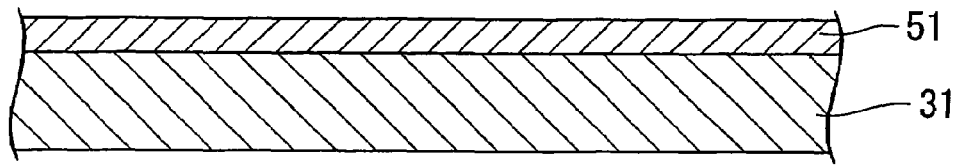
FIG. 4A to 4E are explanatory figures showing a wiring pattern formation method according to a preferred embodiment of the present invention.

Next, the resin material which has been ejected is cured (in step 5). In concrete terms, the UV curing resin, which is the material for formation of the base insulating layer 51, is irradiated for about sixty seconds with UV light of wavelength 365 nm, and is thereby cured. By doing this, the base insulating layer 51 is formed upon the surface of the film substrate 31, as shown in FIG. 4A.

Next the in-layer insulating layer, which will constitute the partition walls when forming the electrical wires 32, is formed. As a preliminary to this, first, the contact angle of the surface of the base insulating layer 51 is adjusted (in step 6). Since the surface of the base insulating layer 51 which has been cured currently exhibits a liquid affinity, this layer 51 is irradiated with excimer UV light with a wavelength of 172 nm, in order to endow its surface with a liquid repellency.

Next, the in-layer insulating layer which surrounds the regions in which the electrical wires 32 are to be formed is formed by coating (in step 7). This coating also, just like the coating of the base insulating layer 51, may be performed by using a liquid drop ejection device.

FIGS. 5A to 8B are process diagrams showing an example of the method for formation of the in-layer insulating layer 54A and of the electrical wiring 32. In each of these figures, FIGS. 5A, 6A, 7A, and 8A are cross-sectional plan views corresponding to FIG. 2A, while FIGS. 5B, 6B, 7B, and 8B are side sectional views taken along the line C-C in FIGS. 5A, 6A, 7A, and 8A.

Figure 5A:
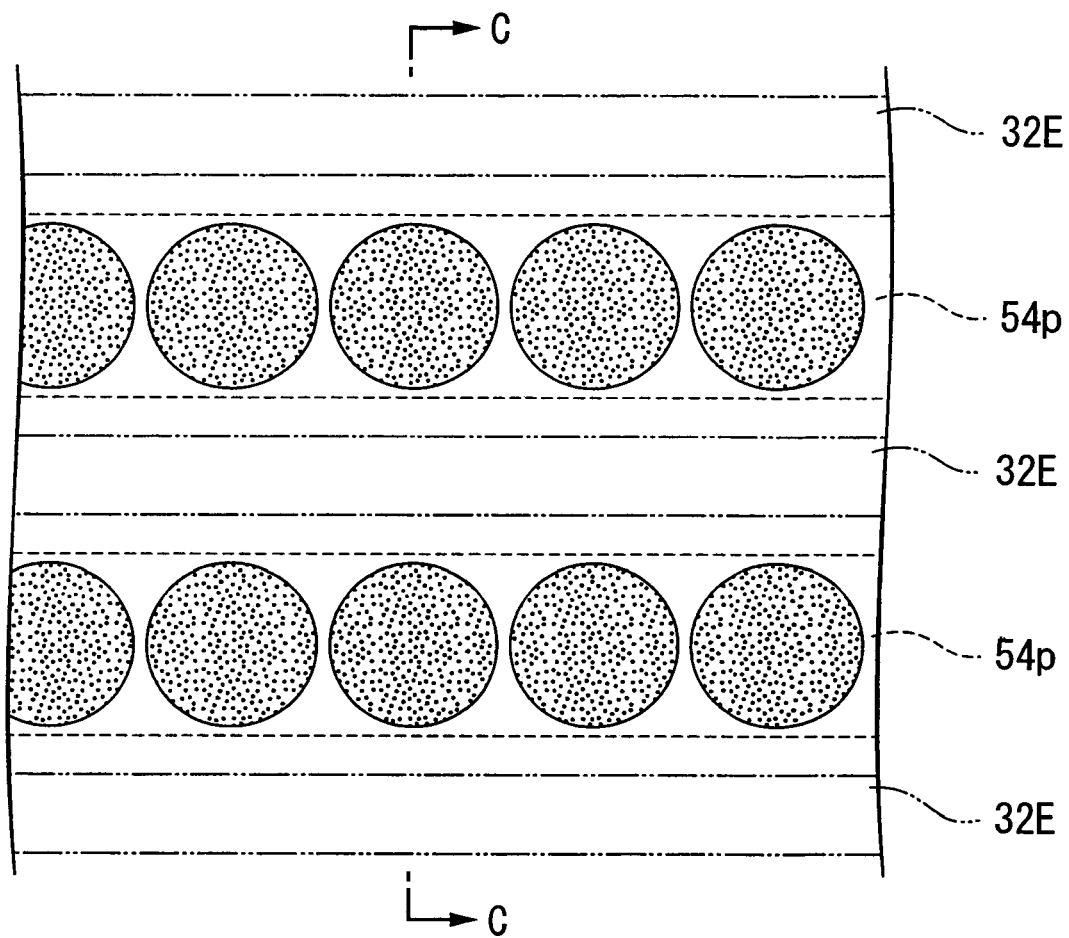
FIGS. 5A and 5B are explanatory figures showing a wiring pattern formation method according to a preferred embodiment of the present invention.
Figure 5B:
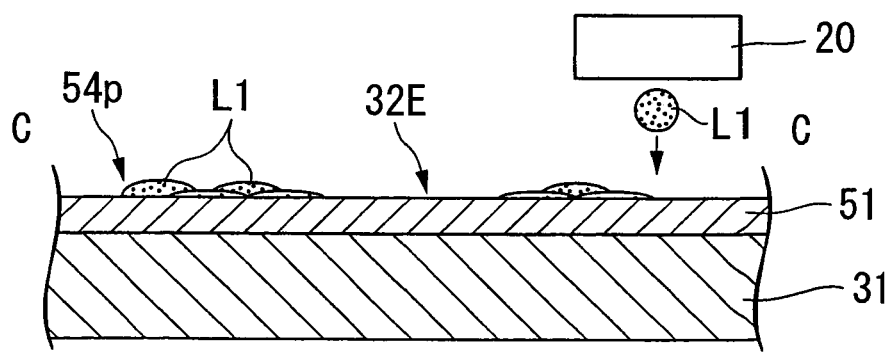

In these processes, first, as shown in FIGS. 5A and 5B, liquid material L1 is ejected along the peripheral edge portions of a region 32E (a wiring formation region) in which the electrical wiring 32 is to be formed, using a liquid drop ejected device 20. As this liquid material L1, it is possible to utilize the same material as the liquid material which was used when forming the base insulating layer. At this time, it is desirable to adjust the degree of overlapping of the liquid drops which are ejected in succession, so that no liquid blobs (bulges) are created. In particular, it is desirable to employ a ejection method such that, in a first ejection event, a plurality of liquid drops L1 are ejected so that they do not come into mutual contact with one another but rather are separated by a certain gap, and, in a second subsequent ejection event, these gaps are filled in. Furthermore, it is desirable to adjust the amount of liquid material L1 which is ejected, so that the thicknesses of the resin layer 54B which is obtained by drying it and of the in-layer insulating layer 54A come to be substantially the same thickness as that of the electrical wiring 32. By making the thicknesses of the electrical wiring 32 and of the in-layer insulating layer 54A substantially equal in this manner, so that the processed surface of the substrate comes to be generally even, the subsequent processes are considerably facilitated. In particular, when forming the electrical wiring 36 of the next layer above, the occurrence of inconveniences such as steps and level variations is prevented. Since, in this preferred embodiment of the present invention, a liquid drop ejection method is utilized for forming this resin layer 54B, accordingly it is possible to control the amount of liquid material which is being ejected in a very accurate manner, and accordingly it is possible to perform the adjustment of the thickness of the resin layer 54B in correspondence to the thickness of the electrical wiring 32 in a comparatively simple and easy manner.

By the above, liquid lines 54p are formed upon the surface of the base insulating layer 51.

Figure 6A:
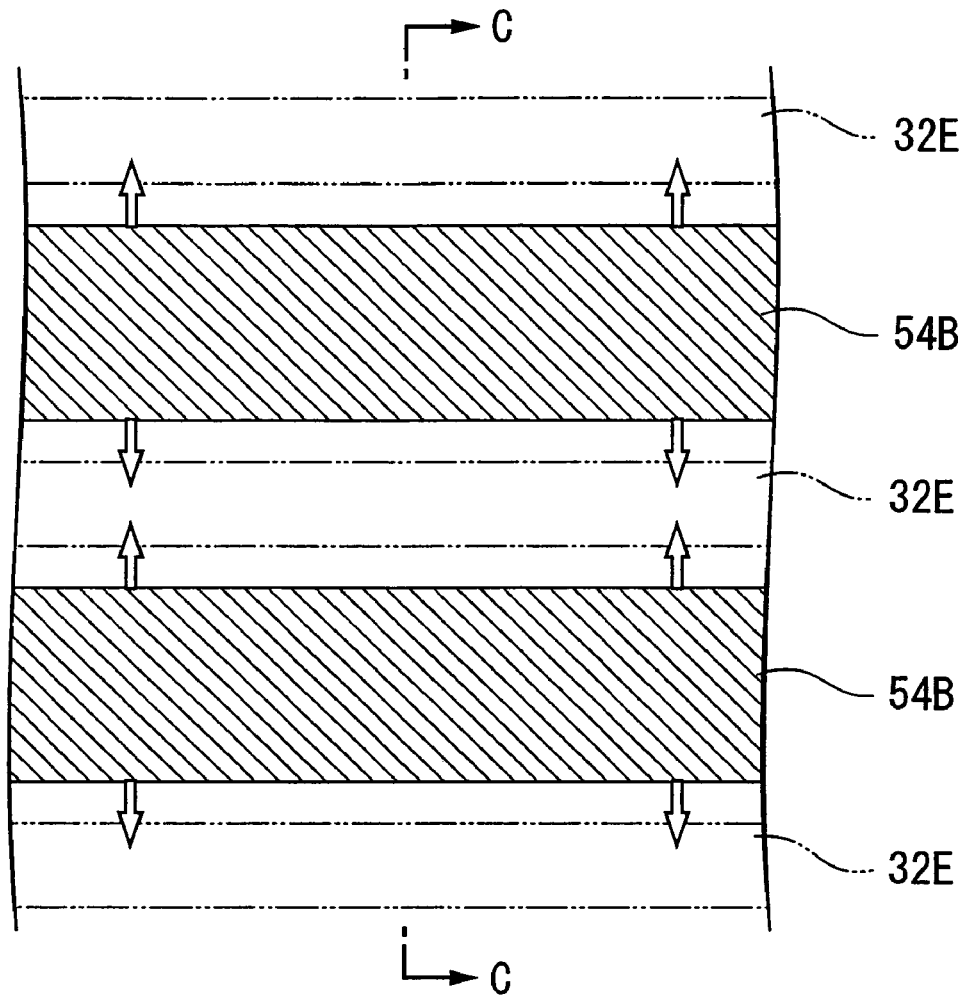
FIGS. 6A and 6B are explanatory figures showing a wiring pattern formation method according to a preferred embodiment of the present invention.
Figure 6B:
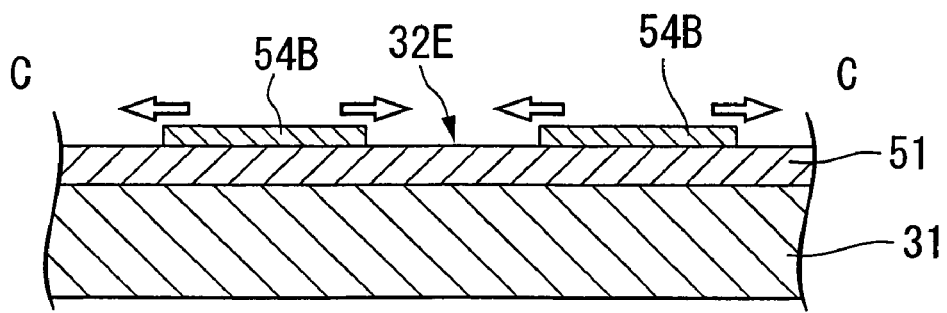

Next, as shown in FIGS. 6A and 6B, a resin layer 54B is formed by provisionally drying the liquid lines 54p.

This provisional drying is performed so as, at least, to dry the surfaces of the liquid lines 54p. In concrete terms, dry air such as air whose humidity is low or an inactive gas or the like is blown towards and against the liquid lines 54p. The temperature of this dry air may be normal temperature (about 25° C.), or may be a high temperature. Furthermore, instead of thus blowing dry air, it would also be acceptable to irradiate infrared rays upon the liquid lines 54p, using an infrared lamp or the like. During this process, the resin layer 54B is not yet completely dried, but is in the state of still possessing residual flowability. In other words, resin material in a non-hardened or a half-hardened state (i.e., the resin layer 54B) is in the state of being disposed around the periphery of the wiring formation region 32E (the region in which the wiring pattern is to be formed).

Next, excimer UV light of a wavelength of 172 nm is irradiated upon the demarcated region which is surrounded by the resin layers 54B (a region which includes the wiring formation region 32E), and thereby liquid affinity imparting process is performed (in step 8). Since a liquid repellency is imparted to the wiring formation region 32E by doing this, the resin layer 54B flows in the direction towards the demarcated region shown by the arrow sign, and thereby the demarcated region is narrowed down.

Figure 7A:
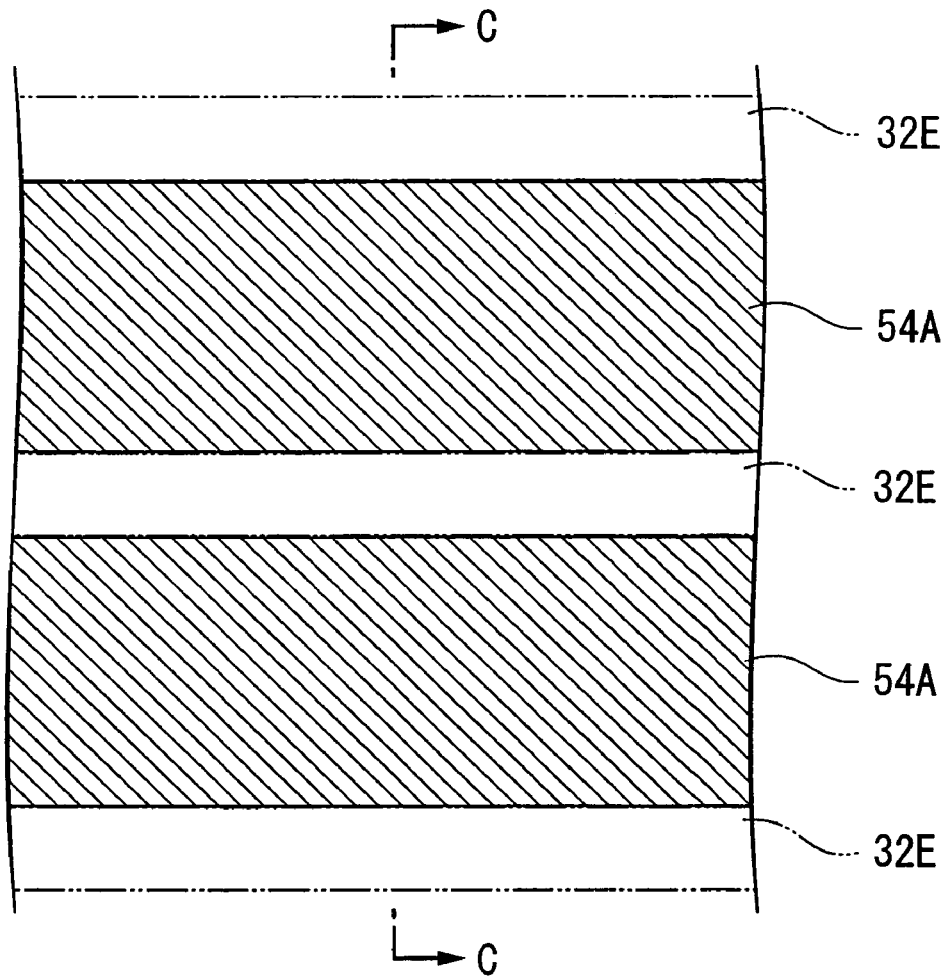
FIGS. 7A and 7B are explanatory figures showing a wiring pattern formation method according to a preferred embodiment of the present invention.
Figure 7B:
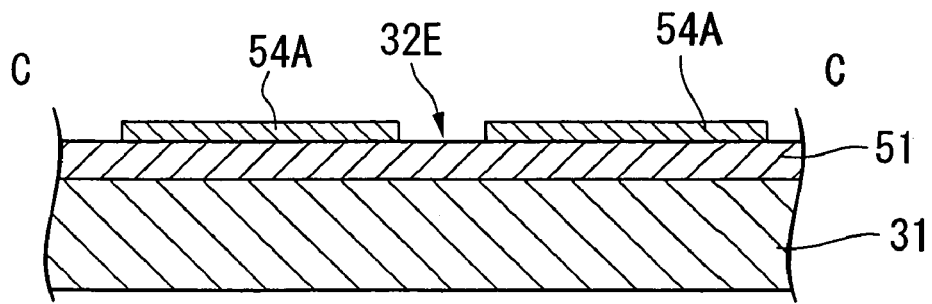

FIGS. 7A and 7B are figures showing the state after the resin layers 54B have thus flowed and shifted. By taking advantage of flowing and shifting of the resin layers 54B in this manner, it is possible to arrange the resin layers at a pitch which is narrower than the pitch which can be implemented by the liquid drop ejection device 20.

Next, the resin layer 54B is cured (in step 9). In concrete terms, UV light of a wavelength of 365 nm is irradiated for about four seconds upon the UV curing resin, which is the material of which the resin layer 54B is formed, so that it is cured thereby. By doing this, the in-layer insulating layer 54A is formed.

Next, the electrical wiring 32 is formed in the region which is demarcated by this in-layer insulating layer 54A. In this process, first, as a preliminary, the contact angle of the surface of the base insulating layer 51 (i.e. of the surface of the wiring formation region 32E) is adjusted (in step 10). As has been described previously, when ejecting the liquid drops which include the material for formation of the electric wiring 32, if the contact angle of the surface of this base insulating layer 51 is too great, then it becomes difficult to form the electrical wires of the predetermined shapes in the predetermined positions, because the liquid drops which have been ejected assume spherical shapes. On the other hand, if the contact angle of the surface of this base insulating layer 51 is too small, then it becomes difficult to miniaturize the electrical wiring, due to the fact that the liquid drops which have been ejected wet the base insulating layer 51 and spread out over it. Since the surface of the base insulating layer 51 which has been cured exhibits a liquid repellency, accordingly, by irradiating excimer UV light of a wavelength of 172 nm for about fifteen seconds upon this surface, it is possible to adjust the contact angle of this surface of the base insulating layer 51. The degree of mitigation of the liquid repellency may be adjusted by adjusting the time period for irradiation by this ultraviolet light, or may also be adjusted by varying the combination of the intensity of the ultraviolet light or its wavelength, or heat processing (heating) which is performed upon the surface, or the like. As other methods of liquid affinity imparting process, there may be cited plasma processing using oxygen as a reaction gas, or immersing processing the substrate in an ambient atmosphere of ozone, or the like.

Figure 8A:
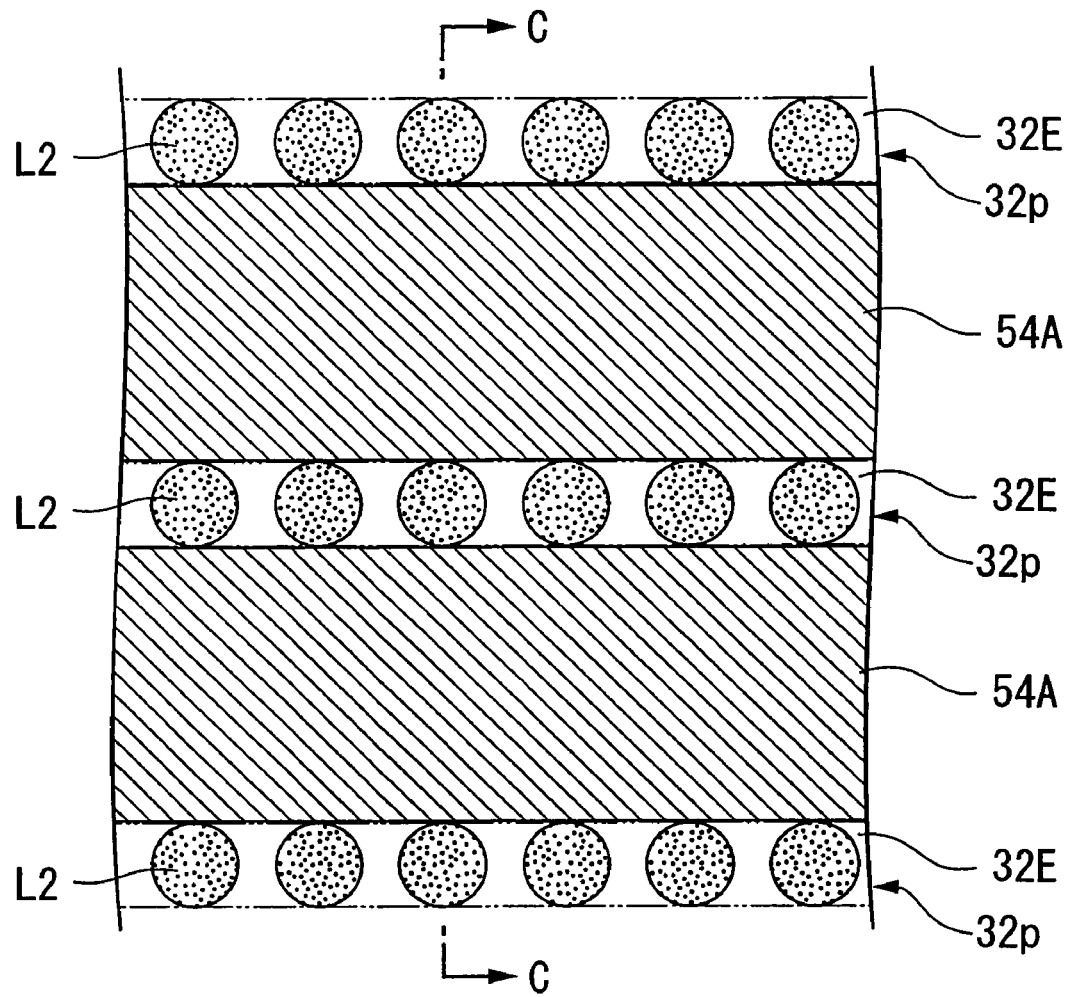
FIGS. 8A and 8B are explanatory figures showing a wiring pattern formation method according to a preferred embodiment of the present invention.
Figure 8B:
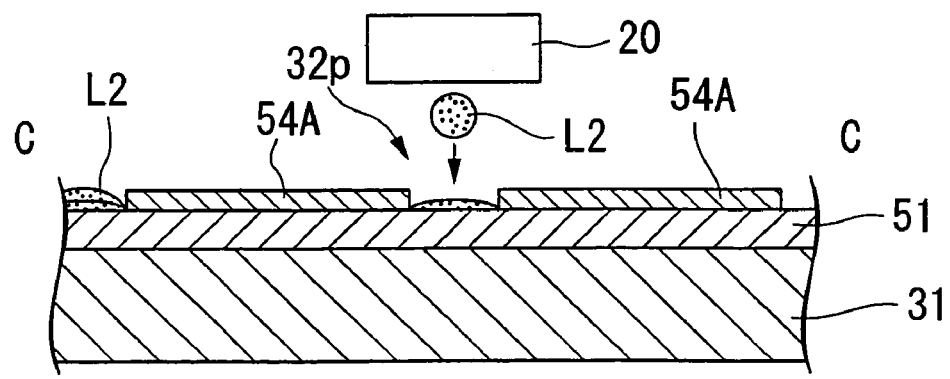
Figure 9A:
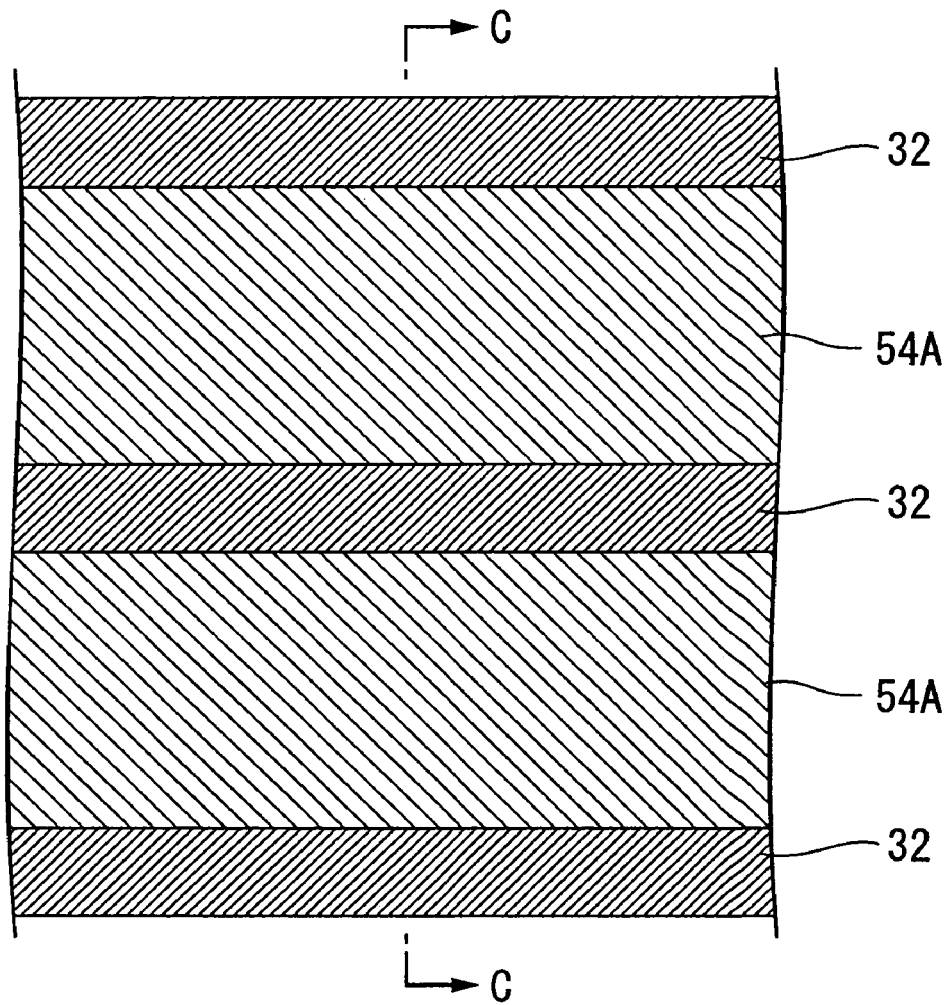
FIGS. 9A and 9B are explanatory figures showing a wiring pattern formation method according to a preferred embodiment of the present invention.
Figure 9B:
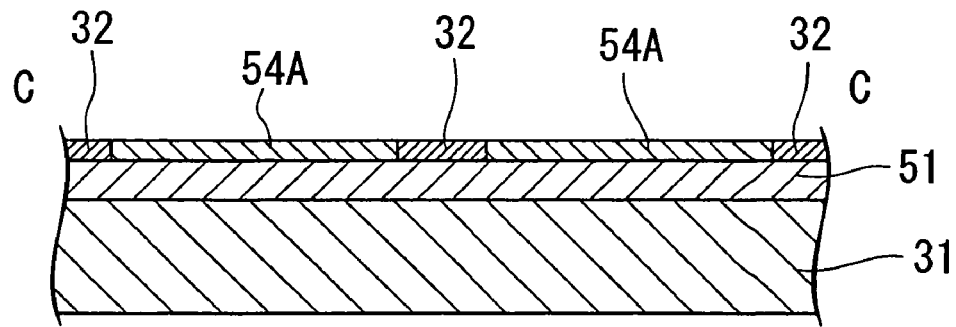

Next, as shown in FIGS. 8A and 8B, liquid lines 32p which will become the electrical wiring are coated in the wiring formation regions 32E which have been narrowed down by the previous process (in step 11). This coating is performed by a liquid drop ejection method, using the liquid drop ejection device which will be described hereinafter. The material which is ejected here consists of drops of a dispersion liquid L2, in which minute electrically conductive particles, which are made from the material which will turn into the electrical wiring, are dispersed within a dispersion medium. For this material, apart from minute metallic particles including any or a mixture of gold, copper, palladium, nickel, or the like, it is possible to utilize minute particles made from an electrically conductive polymer or a superconducting material, or the like.

In order to enhance the dispersivity of the minute electrically conductive particles, an organic substance or the like may be used as a coating upon their surfaces. As a coating material for thus coating the surfaces of the minute electrically conductive particles, for example, there may be suggested a polymer such as one which induces steric hindrance and/or electrostatic repulsion. Furthermore, it is desirable for the particle diameter of the minute electrically conductive particles to be greater than or equal to 5 nm and less than or equal to 0.1 μm. This is because, if this diameter is greater than 0.1 μm, then clogging or blockage of the nozzles occurs easily, and thus ejection by the liquid drop ejection head 20 becomes difficult. On the other hand, if the diameter of the particles becomes less than 5 nm, then the volume ratio of the coating material with respect to the body material of the minute electrically conductive particles becomes great, so that the proportion of organic material in the layer which is obtained becomes too great.

As the dispersion medium which is used, although it is not particularly limited, provided that it is able to disperse the above described minute electrically conductive particles, and provided that it does not cause clumping thereof, other than water, there may be suggested: an alcohol type liquid such as methanol, ethanol, propanol, butanol, or the like; a hydrocarbon type compound such as n-heptane, n-octane, decane, toluene, xylene, cymene, durene, indene, dipentene, tetra-hydro-naphthalene, deca-hydro-naphthalene, cyclohexyl-benzene, or the like; an ether type compound such as ethylene glycol dimethyl-ether, ethylene glycol diethyl ether, ethylene glycol methyl-ethyl ether, diethylene glycol dimethyl-ether, diethylene glycol diethyl ether, diethylene glycol methyl-ethyl ether, 1, 2-dimethoxy ethane, bis-(2-methoxy- ethyl) ether, p-dioxane or the like; or a polar compound such as propylene carbonate, γ-butyro-lactone, N-methyl-2-pyrrolidone, dimethyl-formamide, dimethyl-sulfoxide, cyclo-hexanone or the like. Among these, from the point of view of dispersability of the minute particles and the stability of the dispersion liquid L2, and moreover ease of application to the liquid drop ejection method, the use of water, an alcohol type liquid, a hydrocarbon type compound, or an ether type compound is desirable, and in particular water or a hydrocarbon type compound may be suggested as the dispersion medium. These dispersion mediums may be utilized individually, or in a mixture of two or more thereof.

For the dispersion medium of the liquid L2 which contains the minute electrically conductive particles, it is desirable to utilize a liquid for which the vapor pressure at room temperature is greater than or equal to 0.001 mmHg and is less than or equal to 200 mmHg (i.e., greater than or equal to 0.133 Pa and less than or equal to 26,600 Pa). This is because, if the vapor pressure is greater than 200 mmHg, then after ejection then the dispersion medium evaporates abruptly, and it becomes difficult to form a satisfactory layer.

Furthermore, it is desirable for the vapor pressure of the dispersion medium to be greater than or equal to 0.001 mmHg and is less than or equal to 50 mmHg (i.e., greater than or equal to 0.133 Pa and less than or equal to 6,650 Pa). This is because, if the vapor pressure is greater than 50 mmHg, then, when ejecting the liquid drops by a liquid drop ejection method, nozzle blockage or clogging can easily occur due to drying, and it becomes difficult to maintain a stable ejection state. On the other hand, in the case of a dispersion medium in which the vapor pressure at room temperature is lower than 0.001 mmHg, then the drying process takes place slowly, and there is a danger that some of the dispersion medium may remain within the layer which is created, so that it becomes difficult to obtain an electrical conductive layer of satisfactory quality with the subsequent heating and/or optical processing processes.

The dispersion density when dispersing the above described minute electrically conductive particles in the dispersion medium should be greater than or equal to 1% by mass and less than or equal to 80% by mass, and may be adjusted according to the thickness which is desired for the resulting electrically conductive layer. If this density becomes greater than 80% by mass, then clumping of the particles can easily occur, and it becomes difficult to obtain a uniform resultant layer.

It is desirable for the surface tension of the above described dispersion liquid L2 for the minute electrically conductive particles to be within the range of greater than or equal to 0.02 N/m and less than or equal to 0.07 N/m. This is because, when ejecting this liquid by a liquid drop ejection method, if the surface tension is less than 0.02 N/m, then it becomes easy for the trajectories during flight of the liquid drops to become curved, since the wettability of the material of which the ink is composed with respect to the surface of the nozzle is great; while on the other hand, if the surface tension is greater than 0.07 N/m, then it becomes difficult to control the ejection amount and the ejection timing, since the shape of the meniscus at the tip end of the nozzle is not stable.

In order to adjust this surface tension, it is possible to add to the above described dispersion liquid L2 a small amount of a surface tension adjustment substance such as a fluorine type substance, a silicon type substance, a non-ionic type substance, or the like, within the range in which the contact angle with the base insulating layer 51 is not inappropriately deteriorated. A non-ionic type surface tension adjustment substance is one which serves for satisfactorily increasing the wettability with respect to the base insulating layer 51, improving the leveling characteristics of the resulting layer, and preventing generation of so-called graining and orange-peeling and the like in the coated layer. According to requirements, the above described dispersion liquid L2 may include an organic compound such as an alcohol, an ether, an ester, a ketone, or the like.

It is desirable for the viscosity of the above described dispersion liquid L2 to be greater than or equal to 1 mPa·s and less than or equal to 50 mPa·s. This is because, when ejecting the liquid using the liquid drop ejection method, if the viscosity is less than 1 mPa·s, then it is easy for the area surrounding and in the vicinity of the nozzle to become contaminated due to the ink flowing out; while, on the other hand, if the viscosity is greater than 50 mPa·s, then the frequency of clogging of the nozzle aperture becomes high, and it becomes difficult to eject the liquid drops smoothly.

In this preferred embodiment of the present invention, the liquid drops of the above described dispersion liquid L2 are ejected from the liquid drop ejection head, and impinge at the positions at which the electric wires are to be formed. At this time, it is desirable to adjust the amount of overlapping of the liquid drops which are ejected in succession so as to ensure that liquid blobs (bulges) are not created. In particular, it is desirable to employ a liquid drop ejection method in which, in a first event of liquid drop ejection, a plurality of liquid drops L2 are ejected so as not to be in mutual contact with one another, but rather so as to be separated by certain gaps, and then, in a second event of liquid drop ejection, these gaps or intervals are filled up with further liquid drops. The plurality of liquid drops L2 which are arranged during the first liquid drop ejection event, after having been ejected, are dried naturally or by heating processing, so that it is ensured that, even though they come into contact with the plurality of liquid drops L2 which are arranged between and overlapping them during the second and subsequent events of liquid drop ejection, bulges are not created. Furthermore, since the wetting and spreading out of the liquid drops L2 is controlled and prevented by the in-layer insulating layer 54A which constitutes banks (dams), accordingly it becomes possible to form them of extremely fine width and in a satisfactorily even manner.

By doing this, the lines of liquid 32p are formed upon the surface of the base insulating layer 51.

Next, baking of these liquid lines 32p is performed (in step 12). Since by the process described above the liquid lines 32p are formed in a state of having been provisionally dried, they are now baked properly, all together at once. In concrete terms, this is performed by heating up the film substrate 31 upon which the liquid lines 32p have been formed with a hot plate at 150° C. for about 30 minutes.

Although in this preferred embodiment this baking is performed within a normal atmosphere, according to requirements, it may also be performed in an ambient atmosphere of an inactive gas, such as nitrogen, argon, helium, or the like. Although the processing temperature for this baking is stated as being 150° C., it is desirable to set this temperature appropriately, in consideration of the boiling point of the dispersion medium which is included in the liquid lines 32p (i.e., its vapor pressure), the type and pressure of the ambient gas, the thermal behavior such as the dispersivity and the oxidizability and so on of the minute particles, the presence or absence, and the amount, of any coating material, the heat resistance temperature of the substrate, and the like.

This type of baking processing may be performed with a normal type of hot plate or an electric oven or the like; or it may also be performed by lamp annealing. As for the light source for the light which is used for such lamp annealing, this is not particularly limited; any suitable type of light source may be employed, such as an infrared lamp, a xenon lamp, a YAG laser, an argon laser, a carbonic acid gas laser, or an excimer laser such as one employing XeF, XeCl, XeBr, KrF, KrCl, ArF, ArCl, or the like. Generally, for such a light source, a device should be used which has an output in the range of greater than or equal to 10 W and less than or equal to 5000 W, but, in the case of this preferred embodiment of the present invention, it is considered to be sufficient if its output is in the range of greater than or equal to 100 W and less than or equal to 1000 W.

Figure 4B:
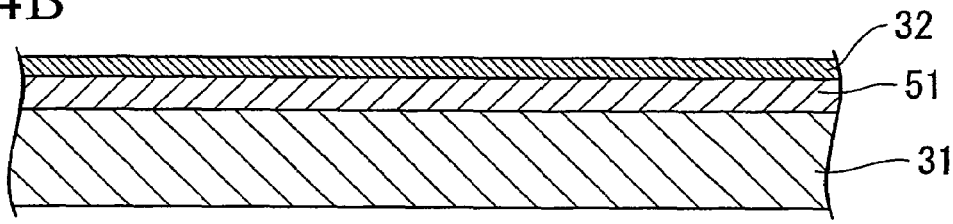

By this type of main baking processing, the dispersion medium which is included within the liquid lines $32p$ is evaporated, and electrical contact between the minute metallic particles is assured. By doing this, the electrical wires 32 are formed, as shown in FIG. 4B.

Figure 4C:
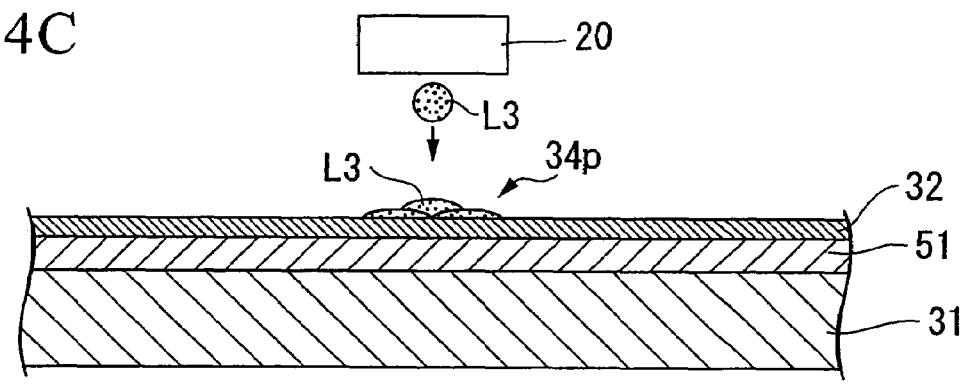

Next a liquid post $34p$, which will become a connecting post, is formed (in step 13) upon a portion of this electrical wiring 32 which has been baked by coating, as shown in FIG. 4C. This coating as well, just like the coating of the liquid lines $32p$ in the step 11, is performed by a liquid drop ejection method, using the liquid drop ejection device which will be described hereinafter. What is ejected, in this case, is a dispersion liquid L3 in which minute electrically conductive particles, which are made from the material which is to be used for forming the connecting post, are dispersed within a dispersion medium; in concrete terms, the same liquid may be used for forming this post, as the one L2 which was used when coating the liquid lines $32p$. In other words, after having coated the liquid lines $32p$, the same liquid material may be ejected for forming the connecting post, using the same liquid drop ejection head 20. This liquid post $34p$ is then dried by natural drying, or by heating processing.

Next, the liquid post $34p$ is subjected to main baking (in step 14). Since, by the processing described above, the liquid sub-posts $34p$ are formed in the state of having been provisionally dried, now these are all subjected to main baking all together. In concrete terms, this is performed by heating up the film substrate 31 upon which the liquid posts $34p$ have been formed with a hot plate at 150° C. for about 30 minutes.

This main baking may be performed within a normal atmosphere, or, according to requirements, it may also be performed in an ambient atmosphere of an inactive gas, such as nitrogen, argon, helium, or the like. Although the processing temperature for this main baking is stated as being 150° C., it is desirable to set this temperature appropriately, in consideration of the boiling point of the dispersion medium which is included in the liquid posts $34p$ (i.e., its vapor pressure), the type and pressure of the ambient gas, the thermal behavior such as the dispersivity and the oxidizability and so on of the minute particles, the presence or absence, and the amount, of any coating material, the heat resistance temperature of the substrate, and the like.

This type of main baking processing may be performed with a normal type of hot plate or an electric oven or the like; or it may also be performed by lamp annealing. As for the light source for the light which is used for such lamp annealing, this is not particularly limited; any suitable type of light source may be employed, such as an infrared lamp, a xenon lamp, a YAG laser, an argon laser, a carbonic acid gas laser, or an excimer laser such as one employing XeF, XeCl, XeBr, KrF, KrCl, ArF, ArCl, or the like. Generally, for such a light source, a device should be used which has an output in the range of greater than or equal to 10 W and less than or equal to 5000 W, but, in the case of this preferred embodiment of the present invention, it is considered to be sufficient if its output is in the range of greater than or equal to 100 W and less than or equal to 1000 W.

Figure 4D:
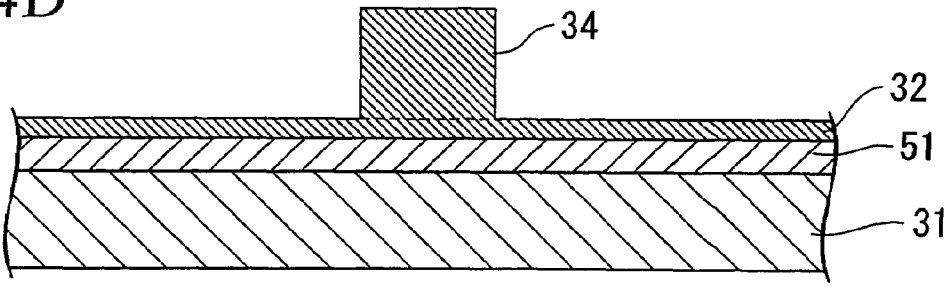
Figure 4E:
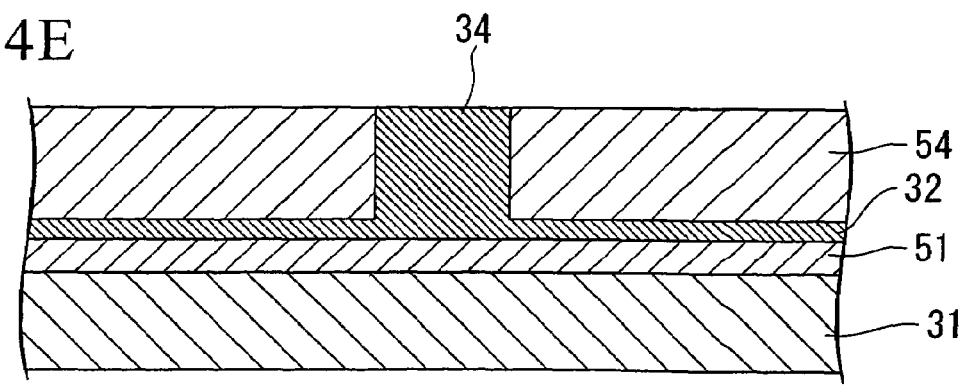

By this type of main baking, the dispersion medium which is included in the liquid posts $34p$ is vaporized, and the electrical contact between the minute metallic particles is assured. By doing this, as shown in FIG. 4D, the connecting posts 34 are formed in predetermined positions upon the electrical wiring 32.

Next, an interlayer insulating layer 54 is coated upon most of the surface of the electrical wiring 32 (in step 15). This coating process as well is performed using a liquid drop ejection device, in the same manner as the coating of the base insulating layer 51. As the liquid material which is used, it is possible to employ the same material as that which was used for the in-layer insulating layer 54A. In this process, it is desirable to eject the liquid material so that it does not contact the connecting posts 34, i.e. by leaving gaps around the peripheries of the connecting posts 34 (that is to say, the interlayer insulating layer 54 is arranged so as to leave gaps between itself and the peripheries of the connecting posts 34).

Next, the liquid material which has been thus ejected is dried, and then the resin material within the liquid material is cured (in step 16). In concrete terms, the UV curing resin, which is the material from which the interlayer insulating layer 54 is formed, is cured by being irradiated with UV light of a wavelength of 365 nm for about 60 minutes. By doing this, the interlayer insulating layer 54 is formed, as shown in FIG. 5D.

Next, an in-layer insulating layer 56 is formed upon the surface of the interlayer insulating layer 54, and then the electrical wiring 36 for the upper layer is formed in regions which have been demarcated by this in-layer insulating layer 56. As a concrete method for doing this, the same processes may be utilized, as in the steps 6 through 12 for forming the electrical wiring for the lower layer, described above. Furthermore, if the steps 15 and 16 are performed, it is possible to form an interlayer insulating layer upon the surface of the electrical wiring 36 for the upper layer.

In this manner, by repeating the steps 6 through 16, it is possible to arrange further layers of electrical wiring as superimposed upon one another. A protective layer 58 may be formed upon the surface of the uppermost layer of electrical wiring, using the same method as in the steps 15 and 16 described above.

By the above processes, the multi layer wiring substrate according to the preferred embodiment of the present invention shown in FIG. 2A and FIG. 2B are manufactured.

Since, as has been described above, in the manufacturing method for a multi layer wiring substrate of this preferred embodiment of the present invention, a liquid drop ejection method is employed for forming each of the electrical wiring and connecting post layers, and the various types of insulating layer, accordingly it becomes possible to enhance the efficiency of utilization of material, and thus it is possible to reduce the cost of manufacture. Furthermore, it becomes possible to increase the number of layers of electrical wiring and to miniaturize the structure. To proffer an example, it becomes possible to achieve a miniaturization in the width of the lines of wiring patterns from a conventional 50 μm to approximately 30 μm, and in the spaces between the lines from a conventional 50 μm to approximately 30 μm. By doing this, it becomes possible to make the FPC more compact, and it accordingly becomes possible to reduce the side of an electro-optical device or an electronic device which employs this FPC, and to make it more compact.

Furthermore since, with the manufacturing method for a multi layer wiring substrate of this preferred embodiment of the present invention, when forming the in-layer insulating layer 54A, the resin layer 54B which is disposed around the wiring formation regions 32E is not completely cured, accordingly it is possible to cause it to flow due to liquid affinity imparting process of the substrate, which would not be the case if the resin layer 54B had been completely cured. In other words, it becomes possible to make the wiring formation regions 32E more narrow and compact by taking advantage of this flowing action, and accordingly it becomes possible to implement a wiring width which is narrower than the wiring width which could be implemented with a prior art type liquid drop ejection device.

Although in the description of this preferred embodiment of the present invention the wiring pattern formation method was explained in terms of its application to a FPC, this should not be considered as being limitative of the present invention; it would also be possible to apply the present invention as a method of forming a wiring pattern upon a hard substrate.

Furthermore, although in the description of this preferred embodiment of the present invention the case of forming connecting posts upon the wiring pattern was explained, the case of forming connecting posts upon electrode lands of the electrical wiring is also to be considered as being included within the technical range of the present invention.

—The Liquid Drop Ejection Device—

Next, the details of a liquid drop ejection device which is used in the liquid drop ejection method described above will be explained using FIG. 10 and FIG. 11.

Figure 10:
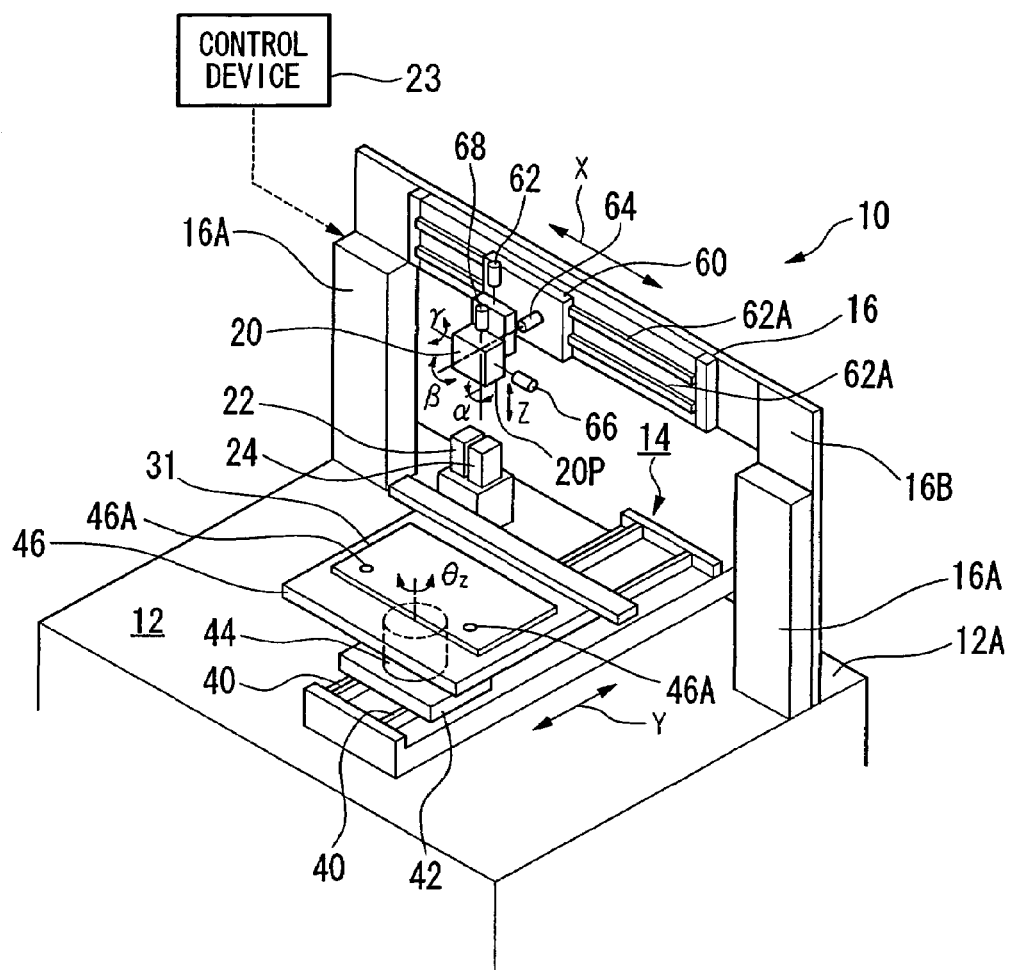
FIG. 10 is a perspective view showing a liquid drop ejection device.

FIG. 10 is a perspective view showing this liquid drop ejection device. In FIG. 10, the X direction is the left and right direction of a base 12, while the Y direction is the forward and rearward direction, and the Z direction is the up and down direction. This liquid drop ejection device 10 includes, as main components, a liquid drop ejection head 20 (hereinafter simply termed a head), and a table 46 upon which the substrate 31 is mounted. The action of this liquid drop ejection device 10 is arranged to be controlled by a control device 23.

The table 46 upon which the substrate 31 is mounted can be shifted in the Y direction by a first shift means 14 which determines its position in the Y direction, and also can be swiveled around a θz direction by a motor 44 which also determines its position around the θz direction. On the other hand, the head 20 can be shifted in the X direction by a second shift means which determines its position in the X direction, and also can be shifted in the Z direction by a linear motor 62 which determines its position in the Z direction. Furthermore, the head 20 can also be swiveled around α, β, and γ directions by respective motors 64, 66, and 68, which determine its positions around the α, β, and γ directions. In this manner, with this liquid drop ejection device 10, it is arranged to be possible accurately to control the relative position and attitude of an ink ejection surface 20P of the head 20, and of the substrate 31 upon the table 46.

Figure 11:
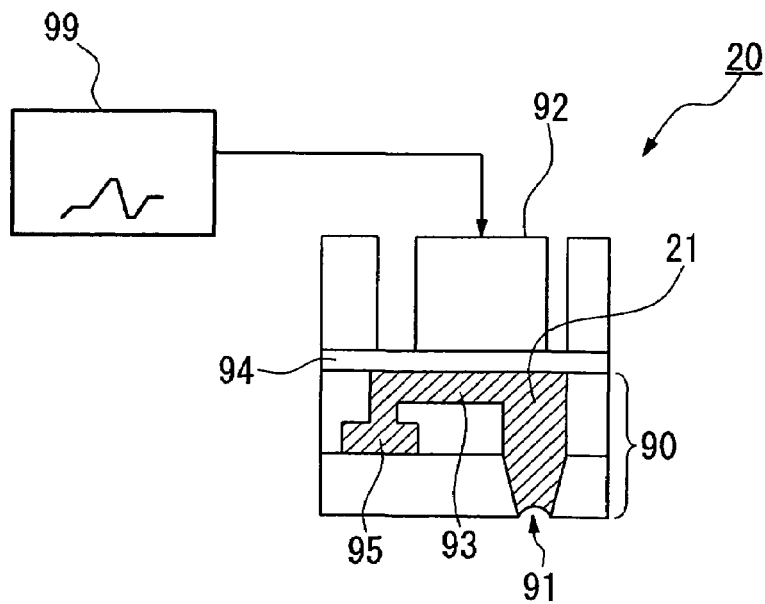
FIG. 11 is a transverse sectional view showing a liquid drop ejection head.

Now an example of the structure of the head 20 will be explained with reference to FIG. 11. FIG. 11 is a side sectional view of this liquid drop ejection head 20. This head 20 is one which ejects ink 21 from a nozzle 91. As the method for liquid drop ejection, it is possible to employ any one of various per se known techniques, such as, for example, a piezo method in which the ink is ejected using a piezo element, which is a piezoelectric element, or a method of ejecting the ink by heating it up so as to generate bubbles therein. Among these methods, the piezo method exhibits the beneficial feature that, since the ink is not subjected to heating, no influence is exerted upon the composition of its material.

In this case, in the head 20 shown in FIG. 11, the above described piezo method is employed.

In a head main body 90 of the head 20, there are formed a reservoir 95 and a plurality of ink chambers 93 which branch off from the reservoir 95. The reservoir 95 constitutes a flow path for supplying ink to each of the ink chambers 93. Furthermore, a nozzle plate which constitutes an ink ejection surface is fitted upon the lower end surface of the head main body 90. A plurality of nozzles 91 which eject ink are opened in this nozzle plate, and correspond to the ink chambers 93. Ink flow conduits are formed from each of the ink chambers 93 to lead to the corresponding ones of the nozzles 91. On the other hand, a vibration plate 94 is fitted to the upper end surface of the head main body 90. This vibration plate 94 constitutes a wall surface of each of the ink chambers 93. Piezo elements 92 are provided on the outside of this vibration plate 94, corresponding to each of the ink chambers 93. These piezo elements 92 are ones in which a piezoelectric material such as quartz crystal or the like is sandwiched between a pair of electrodes (not shown in the figures). This pair of electrodes is connected to a drive circuit 99.

When a voltage is applied to any one of the piezo elements 92 from the drive circuit 99, that piezo element is deformed so as to expand or contract. When the piezo element 92 thus deforms by contraction, the pressure within the ink chamber 93 drops, and ink 21 is sucked into the ink chamber 93 from the reservoir 95. Furthermore, when the piezo element 92 deforms by expanding, the pressure within the ink chamber 93 increases, and some of the ink 21 within the ink chamber 93 is ejected from its nozzle 91. It is possible to control the amount of deformation of the piezo element 92 by varying the applied voltage. Furthermore, it is possible to control the speed of deformation of the piezo element 92 by varying the frequency of the applied voltage. In other words, it is arranged to control the conditions of ejection of the ink 21 by controlling the parameters of the voltage which is applied to the piezo element 92.

A capping unit 22 which is shown in FIG. 10 is a device for capping the ink ejection surface 20P of the head 20 when the liquid drop ejection device 10 is in the waiting state, in order to prevent the drying out of the ink ejection surface 20P of the head 20. Furthermore, a cleaning unit 24 is a device for aspirating the interiors of the nozzles in the head 20, in order to prevent and clean out clogging of the nozzles. This cleaning unit 24 may also perform wiping of the ink ejection surface 20P, in order to prevent and clean off dirt upon the ink ejection surface 20P of the head 20.

—An Electro-Optical Device—

An example of manufacture of a wiring pattern upon a FPC with the preferred embodiment of the present invention will now be explained. Here, returning to FIG. 1, the manufacture of a liquid crystal module, which is an example of an electro-optical device in which this FPC is employed, will be explained.

FIG. 1 is an exploded perspective view showing a liquid crystal module of a COF (Chip On Film) construction. This liquid crystal module 1 includes, as main components, a liquid crystal panel 2 for color display, a FPC 30 which is connected to this liquid crystal panel 2, and an IC 100 for liquid crystal drive, which is implemented with a FPC 30. According to requirements, various other peripheral devices such as an illumination device for backlighting and the like may be fitted to this liquid crystal panel 2.

The liquid crystal panel 2 includes a pair of substrates 5a and 5b which are fixed together by a seal member 4, and a mass of liquid crystal material is charged into the gap which is formed between these substrates 5a and 5b, which is the so called cell gap. To put it in another manner, the liquid crystal material is sandwiched between the substrate 5a and the substrate 5b. These substrates 5a and 5b are generally made from a material which is transparent to light for example, from glass or a synthetic resin or the like. A light polarizing plate 6a is adhered to the exterior surface of the substrate 5a.

Furthermore, electrodes 7a are formed upon the interior side surface of the substrate 5a, and electrodes 7b are formed upon the interior side surface of the substrate 5b. These electrodes 7a and 7b are made from a material which is transparent to light, such as, for example, ITO (Indium Tin Oxide) or the like. The substrate 5a includes an extended portion which projects out with respect to the substrate 5b, and a plurality of terminals 8 are formed upon this extended portion. These terminals 8 are formed at the same time as the electrodes 7a, when the electrodes 7a are being formed upon the substrate 5a. Accordingly, these terminals 8 are also formed from, for example, ITO or the like. Among these terminals 8, there are included terminals which are formed integrally with and extending from the electrodes 7a, and there are also included other terminals which are connected to the electrodes 7b via electrically conductive members not shown in the figures.

On the other hand, upon the surface of the FPC 30, there is formed a wiring pattern by the wiring pattern formation method of the preferred embodiment of the present invention. In other words, a wiring pattern 39a for input is formed extending towards the center of the FPC 30 from one of its short sides, and a wiring pattern 39b for output is formed extending towards the center of the FPC 30 from the other one of its short sides. At the end portions in the center of these wiring patterns 39a and 39b for input and output, there are formed electrode pads, not shown in the figures.

An IC 100 for liquid crystal drive is fitted to the surface of this FPC 30. In concrete terms, a plurality of bump electrodes which are formed on the functional surface of this IC 100 for liquid crystal drive are connected to a plurality of electrode pads which are formed upon the surface of the FPC 30 via an ACF 160 (Anisotropic Conductive Film: a film which is anisotropically electrically conductive). This ACF 160 is made by dispersing a large number of electrically conductive particles within an adhesive resin which is thermoplastic or thermosetting. In this manner, by fitting the IC 100 for liquid crystal drive to the surface of the FPC 30, it is possible to implement a so called COF structure.

This FPC 30 upon which the IC 100 for liquid crystal drive has been fitted is connected to the substrate 5a of the liquid crystal panel 2. In concrete terms, the wiring pattern 39b for output of the FPC 30 is electrically connected to the terminals 8 of the substrate 5a via an ACF 140. Since the FPC 30 is flexible, it is practicable to implement reduction of the space which it occupies, by folding it up at least to some extent.

With the liquid crystal module which has been built in the above described manner, a signal is inputted to the IC 100 for liquid crystal drive via the wiring pattern 39a for input of the FPC 30. When this is done, drive signals are outputted to the liquid crystal panel 2 from the IC 100 for liquid crystal drive via the wiring pattern for output of the FPC 30. Due to this, image display is performed by the liquid crystal panel 2.

Within the scope of the electro-optical device of the present invention, apart from devices which provide an electro-optical effect of altering their transmittivity for light by varying the refractive index of a substance with an electric field, there are also included devices which convert electrical energy into optical energy, or the like. In other words, the present invention is not to be considered as being limited in its application to a liquid crystal display device; it could also be widely applied, such as to, for example, various types of light emitting device, such as an organic EL (Electro-Luminescent) device or an inorganic EL device, a plasma display device, an electrophoretic display device, a display device which uses an electron emission element such as a FEDSCEED (Field Emission Display and Surface Conduction Electron Emitter Display), or the like. Moreover, it would also be possible to manufacture an organic EL module by connecting a FPC which includes a wiring pattern according to the present invention to an organic EL panel.

—Electronic Devices—

Figure 12:
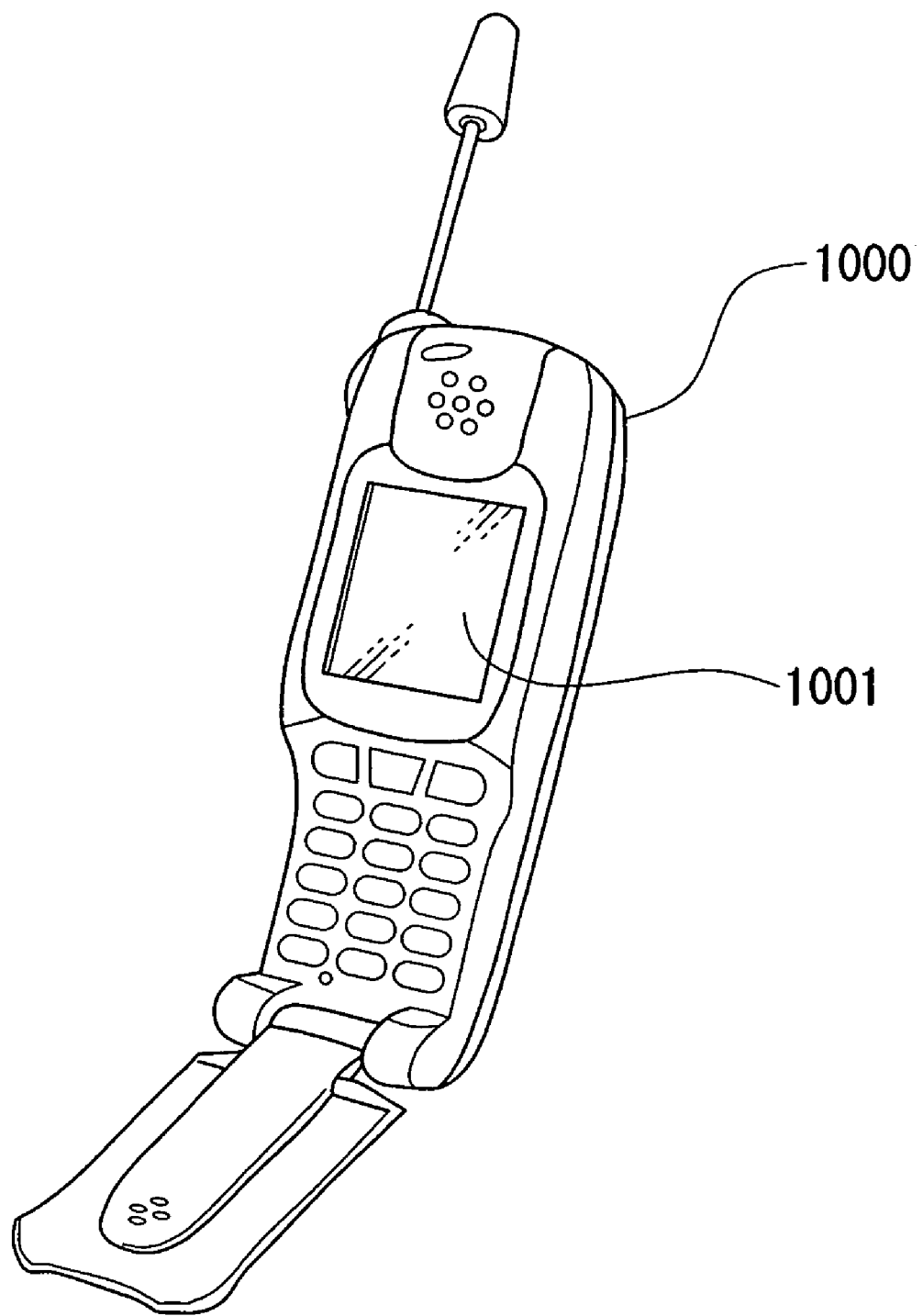
FIG. 12 is a perspective view showing a portable telephone, which is an example of an electronic device according to a preferred embodiment of the present invention.

Next, an electronic device which has been manufactured by employing the layer formation method according to the preferred embodiment of the present invention will be explained with reference to FIG. 12. FIG. 12 is a perspective view of a portable telephone. The reference symbol 1000 in FIG. 12 denotes the portable telephone as a whole, while the reference symbol 1001 denotes a display section thereof. In this display section 1001 of this portable telephone 1000, there is employed an electro-optical device which includes a wiring pattern according to the preferred embodiment of the present invention. Accordingly, it is possible to provide a compact portable telephone 1000 which is excellent from the point of view of reliability of the electrical connections therein.

The present invention is not limited to application to the portable telephone described above; it may also be appropriately applied to an electronic book, a personal computer, a digital still camera, a liquid crystal television, a viewfinder type or direct vision type monitor for a video tape recorder, a car navigation device, pager, an electronic notebook, a calculator, a word processor, a work station, a television telephone, a POS terminal, or an image display means such as a touch panel or the like for an electronic device; and, in each and any of these cases, it is capable of providing a compact electronic device which excels with regard to the reliability of its electrical connections.

The technical scope of the present invention is not limited to the preferred embodiments described above; various changes and/or additions to any of the preferred embodiments described above are also to be understood as falling within the scope of the present invention, provided that its gist is not departed from. In other words, any appropriate modifications may be made, since the tangible materials and structures and so on proposed in each of the preferred embodiments described above are only cited by way of example, and other such materials and structures may be substituted, within the scope of the appended claims.

What is claimed is:

1. A wiring pattern formation method in which a wiring pattern is formed by arranging, in a region which is demarcated by a partition wall, liquid material which includes an electrically conductive material, comprising:

arranging a resin material around the periphery of a region upon which the wiring pattern is to be formed;

imparting liquid affinity to a demarcated region which has been demarcated by the resin material;

narrowing down the demarcated region by flowing out the resin material towards and into the demarcated region; and forming the partition wall by curing the resin material.

2. A wiring pattern formation method as according to claim 1, wherein the resin material is arranged in a non-hardened or semi-hardened state.

3. A wiring pattern formation method as according to claim 1, wherein the imparting liquid affinity is performed by irradiating the demarcated region with excimer UV light.

4. A wiring pattern formation method as according to claim 3, wherein the excimer UV light is light of a wavelength of 172 nm.

5. A wiring pattern formation method as according to claim 1, wherein the arrangement process for the resin material is performed by a liquid drop ejection method.

6. A manufacturing method for a multi layer wiring substrate which comprises a plurality of mutually superimposed wiring layers with an insulating layer between each adjacent pair of superimposed wiring layers, and in which the wiring patterns upon the plurality of wiring layers are mutually electrically connected together via connecting posts which pierce through the insulating layer, in which the wiring pattern comprised in at least one of the plurality of wiring layers is formed by a wiring pattern formation method as according to claim 1.

* * * * *